United States Patent
Sole et al.

(10) Patent No.: US 9,654,143 B2
(45) Date of Patent: May 16, 2017

(54) CONSECUTIVE BIT ERROR DETECTION AND CORRECTION

(71) Applicant: Intel Corporation, Santa Clara, CA (US)

(72) Inventors: Guillem Sole, Barcelona (ES); Roger Espasa, Barcelona (ES); Sorin Iacobovici, San Jose, CA (US); Brian Hickmann, Sherwood, OR (US); Wei Wu, Portland, OR (US); Thomas Fletcher, Sherwood, OR (US)

(73) Assignee: Intel Corporation, Santa Clara, CA (US)

(*) Notice: Subject to any disclaimer, the term of this patent is extended or adjusted under 35 U.S.C. 154(b) by 107 days.

(21) Appl. No.: 14/308,107

(22) Filed: Jun. 18, 2014

(65) Prior Publication Data

US 2015/0370636 A1   Dec. 24, 2015

(51) Int. Cl.
| | |
|---|---|
| *G06F 11/10* | (2006.01) |
| *H03M 13/09* | (2006.01) |
| *H03M 13/17* | (2006.01) |
| *H03M 13/19* | (2006.01) |
| *H03M 13/29* | (2006.01) |

(52) U.S. Cl.
CPC .......... *H03M 13/09* (2013.01); *H03M 13/17* (2013.01); *H03M 13/19* (2013.01); *H03M 13/29* (2013.01)

(58) Field of Classification Search
CPC .................................................. G06F 11/1012
See application file for complete search history.

(56) References Cited

U.S. PATENT DOCUMENTS

| | | | | | |
|---|---|---|---|---|---|
| 4,404,673 | A | * | 9/1983 | Yamanouchi | ....... H03M 13/091 714/6.24 |
| 4,617,664 | A | * | 10/1986 | Aichelmann, Jr. | . G06F 11/1028 714/758 |
| 4,665,537 | A | * | 5/1987 | Moriyama | ........ H03M 13/1515 714/755 |

(Continued)

*Primary Examiner* — Steve Nguyen
(74) *Attorney, Agent, or Firm* — Nicholson De Vos Webster & Elliott LLP

(57) ABSTRACT

Embodiments of an invention for consecutive bit error detection and correction are disclosed. In one embodiment, an apparatus includes a storage structure, a second storage structure, a parity checker, an error correction code (ECC) checker, and an error corrector. The first storage structure is to store a plurality of data values, a plurality of parity values, and a plurality of ECC values, each parity value corresponding to one of the plurality of data values, a first bit of each parity value corresponding to a first of a plurality of portions of a corresponding data value, wherein the first of the plurality of portions of the corresponding data value is interleaved with a second of the plurality of portions of the corresponding data value, wherein a second bit of each parity value corresponds to a second of the plurality of portions of the corresponding data value, each ECC value corresponding to one of the plurality of data values. The parity checker is to detect a parity error in a data value stored in the first storage structure using a parity value corresponding to the data value. The ECC checker is to generate a syndrome. The error corrector is to detect and correct consecutive bit errors in the data value using the syndrome.

15 Claims, 4 Drawing Sheets

(56) References Cited

U.S. PATENT DOCUMENTS

| | | | | |
|---|---|---|---|---|
| 4,669,084 A * | 5/1987 | Hartman | ............... | H03M 13/39 |
| | | | | 714/786 |
| 6,009,548 A * | 12/1999 | Chen | ................... | G06F 11/1012 |
| | | | | 714/718 |
| 6,327,106 B1 * | 12/2001 | Rothberg | .............. | G06F 3/0607 |
| | | | | 360/53 |
| 6,523,146 B1 * | 2/2003 | Ishikawa | ............. | H03M 13/235 |
| | | | | 714/786 |
| 7,237,175 B2 * | 6/2007 | Hatakenaka | ........ | G06F 11/1012 |
| | | | | 714/763 |
| 8,984,384 B1 * | 3/2015 | Juels | ....................... | G06F 21/64 |
| | | | | 714/800 |

* cited by examiner

METHOD 400

CONSECUTIVE BIT ERROR DETECTION AND CORRECTION

BACKGROUND

1. Field

The present disclosure pertains to the field of information processing, and more particularly, to the field of error detection and correction in information processing systems.

2. Description of Related Art

Faults or errors may occur in information processing systems for a variety of reasons. Dynamic variations such as voltage droop, static variations such as transistor device threshold voltage variations, critical path violations due to aging, circuit marginalities, alpha particle and high-energy neutron strikes, and many other factors may alone or in combination result in or contribute to errors.

One example of such errors is the phenomenon of soft errors, which arise when alpha particles and high-energy neutrons strike integrated circuits and alter the charges stored on the circuit nodes. If the charge alteration is sufficiently large, the voltage on a node may be changed from a level that represents one logic state to a level that represents a different logic state, in which case the information stored on that node becomes corrupted. Generally, soft error rates increase as the level of integration increases, because the likelihood that a striking particle will hit a voltage node in a die increases when more circuitry is integrated into a single die. Likewise, as operating voltages decrease, the difference between the voltage levels that represent different logic states decreases, so less energy is needed to alter the logic states on circuit nodes and more soft errors arise. Therefore, as improvements in integrated circuit manufacturing technologies continue to provide for greater levels of integration and lower operating voltages in microprocessors and other information processing apparatuses, error detection and correction becomes increasingly important.

One approach to detecting and sometimes correcting errors, including soft errors, is to add storage elements for parity or error-correcting-code (ECC) values to information storage structures. However, the addition of these storage elements increases the size of the storage structure, and the increase in size is typically proportional to the level of detection/correction provided.

BRIEF DESCRIPTION OF THE FIGURES

The present invention is illustrated by way of example and not limitation in the accompanying figures.

DETAILED DESCRIPTION

Figure 1:
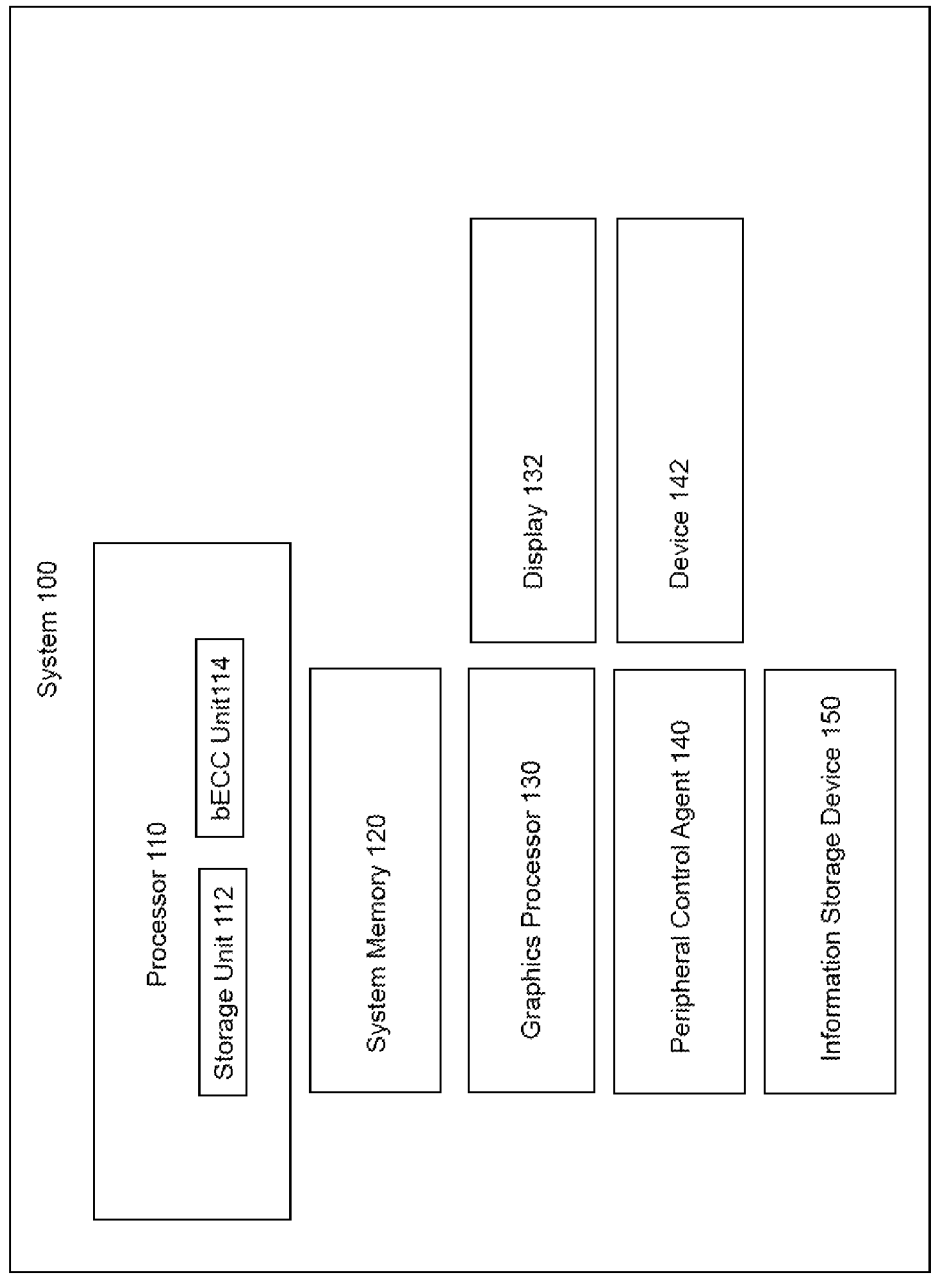
FIG. 1 illustrates an information processing system including consecutive bit error detection and correction according to an embodiment of the present invention.

Embodiments of an invention for consecutive bit error detection and correction are described. In this description, numerous specific details, such as processor and system configurations, may be set forth in order to provide a more thorough understanding of the present invention. It will be appreciated, however, by one skilled in the art, that the invention may be practiced without such specific details. Additionally, some well-known structures, circuits, and other features have not been shown in detail, to avoid unnecessarily obscuring the present invention. For example, a complete description of error-correcting-code (ECC) techniques is not provided, as a number of known approaches may be used in embodiments of the present invention.

In the following description, references to "one embodiment," "an embodiment," "example embodiment," "various embodiments," etc., indicate that the embodiment(s) of the invention so described may include particular features, structures, or characteristics, but more than one embodiment may and not every embodiment necessarily does include the particular features, structures, or characteristics. Further, some embodiments may have some, all, or none of the features described for other embodiments.

As used in this description and the claims, and unless otherwise specified, the use of the ordinal adjectives "first," "second," "third," etc. to describe an element merely indicate that a particular instance of an element or different instances of like elements are being referred to, and is not intended to imply that the elements so described must be in a particular sequence, either temporally, spatially, in ranking, or in any other manner.

Also, the terms "bit," "flag," "field," "entry," "indicator," etc., may be used to describe any type of location in a register, table, database, or other data or storage structure, whether implemented in hardware or software, but are not meant to limit embodiments of the invention to any particular type of location or number of bits or other elements within any particular location. The term "clear" may be used to indicate storing or otherwise causing the logical value of zero to be stored in a storage location, and the term "set" may be used to indicate storing or otherwise causing the logical value of one, all ones, or some other specified value to be stored in a storage location; however, these terms are not meant to limit embodiments of the present invention to any particular logical convention, as any logical convention may be used within embodiments of the present invention. The terms "zero" or "0" and "one" or "1" may be used to describe the values of binary digits ("bits") of data or other information, where the former may be any voltage or other level that represents a logical "zero" or "off" value, and the latter may be any such level that represents a logical "one" or "on" value.

As described in the background section, storage elements may be added to information storage structures to provide for error detection and/or correction in information processing systems. The overhead or cost of these additional elements is typically proportional to the level of detection/correction provided. For example, for protecting 128 bits of data, a typical single-error-correction, double-error-detection technique requires 9 check bits, but a double-error-correction, triple-error-detection ("DECTED") technique requires 17 check bits. In addition to the cost of the area, adding check bits to a cache, register file, or other buffer, array, or structure to support higher levels of protection may also add cost in terms of power and performance because additional circuitry and/or operations may be needed to read, write, and operate on the check bits. However, the need for higher levels of protection increases as circuit dimensions decrease, because the probability of multi-bit errors resulting from a single particle strike increases.

Therefore, embodiments of the present invention may be desirable to provide greater levels of protection at a lower cost. One such embodiment uses a new Hamming code to provide error correction for two consecutive bits and error detection for four consecutive bits, using 12 check bits for 128 data bits. In this embodiment, four of the check bits provide for error detection and may be included in the main array or structure, and the other eight check bits provide for error correction and may be moved out of the main array and into an auxiliary structure in order to reduce the area, power, and performance costs of the error correction.

A technique according to any such embodiment may be referred to as "bursty" double-error-correction, quad-error-detection (bDECQED), where "bursty" refers to errors in multiple consecutive or adjacent bits, perhaps caused by a single event such as a particle strike to a dense array, and where consecutive or adjacent may mean physically consecutive or adjacent but physical-to-logical bit mapping may be used to apply error correction according to invention embodiments to a wide variety of bit numbering schemes. For example, bursty error correction according to embodiments of the present invention may be applied to bits having a fixed stride between them. With a stride of one, physical bit numbers may be mapped one-to-one to logical bit numbers, such that data bit 0 (as used in the description below) is physically adjacent to data bit 1 (as used in the description below). With a stride of three, consecutive physical bit numbers may be assigned to logical bit numbers that differ by three (except at the extremes), for example as illustrated in Table 1, which shows a scheme for assigning 32 physical bits to 32 logical bits. As may be appreciated by those skilled in the art, many other variations are possible within the scope of the present invention.

TABLE 1

| Physical Bit Number | Logical Bit Number |
| --- | --- |
| 0 | 0 |
| 1 | 3 |
| 2 | 6 |
| 3 | 9 |
| 4 | 12 |
| 5 | 15 |
| 6 | 18 |
| 7 | 21 |
| 8 | 24 |
| 9 | 27 |
| 10 | 30 |
| 11 | 1 |
| 12 | 4 |
| 13 | 7 |
| 14 | 10 |
| 15 | 13 |
| 16 | 16 |
| 17 | 19 |
| 18 | 22 |
| 19 | 25 |
| 20 | 28 |
| 21 | 31 |
| 22 | 2 |
| 23 | 5 |
| 24 | 8 |
| 25 | 11 |
| 26 | 14 |
| 27 | 17 |
| 28 | 20 |
| 29 | 23 |
| 30 | 26 |
| 31 | 29 |

FIG. 1 illustrates system 100, an information processing system including consecutive bit error detection and correction according to an embodiment of the present invention. System 100 may represent any type of information processing system, such as a server, a desktop computer, a portable computer, a set-top box, a hand-held device such as a tablet computer, or a smart phone, or an embedded control system. System 100 includes processor 110, system memory 120, graphics processor 130, peripheral control agent 140, and information storage device 150. Systems embodying the present invention may include any number of each of these components and any other components or other elements, such as peripherals and input/output devices. Any or all of the components or other elements in this or any system embodiment may be connected, coupled, or otherwise in communication with each other through any number of buses, point-to-point, or other wired or wireless interfaces or connections, unless specified otherwise. Any components or other portions of system 100, whether shown in FIG. 1 or not shown in FIG. 1, may be integrated or otherwise included on or in a single chip (a system-on-a-chip or SOC), die, substrate, or package.

System memory 120 may be dynamic random access memory or any other type of medium readable by processor 110. Graphics processor 130 may include any processor or other component for processing graphics data for display 132. Peripheral control agent 140 may represent any component, such as a chipset component, including or through which peripheral, input/output (I/O), or other components or devices, such as device 142 (e.g., a touchscreen, keyboard, microphone, speaker, other audio device, camera, video or other media device, network adapter, motion or other sensor, receiver for global positioning or other information, etc.) and/or information storage device 150, may be connected or coupled to processor 110. Information storage device 150 may include any type of persistent or non-volatile memory or storage, such as a flash memory and/or a solid state, magnetic, or optical disk drive.

Processor 110 may represent one or more processors or processor cores integrated on a single substrate or packaged within a single package, each of which may include multiple threads and/or multiple execution cores, in any combination. Each processor represented as or in processor 110 may be any type of processor, including a general purpose microprocessor, such as a processor in the Intel® Core™ Processor Family or other processor family from Intel® Corporation or another company, or a special purpose processor such as a graphics processor or a microcontroller. Processor 110 may be architected and designed to operate according to any instruction set architecture, with or without being controlled by microcode. Furthermore, processor 110 may represent any device or component in an information processing system in which an embodiment of the present invention may be implemented.

Consecutive bit error detection and correction according to embodiments of the present invention may be used to protect any information or data storage structure, including a cache, a register file, and a reorder buffer, in a processor, such as processor 110, or any other component or device in an information processing system, such as system 100, but for convenience such a data storage structure is represented in processor 110 in FIG. 1 as storage unit 112.

Support for consecutive bit error detection and correction according to embodiments of the present invention may be implemented in a processor, such as processor 110, or any other component or device in an information processing system, such as system 100, using any combination of circuitry and/or logic embedded in hardware, microcode, firmware, and/or other structures arranged as described below or according to any other approach, but for convenience is represented in processor 110 in FIG. 1 as bECC (bursty ECC) unit 114.

Figure 2:
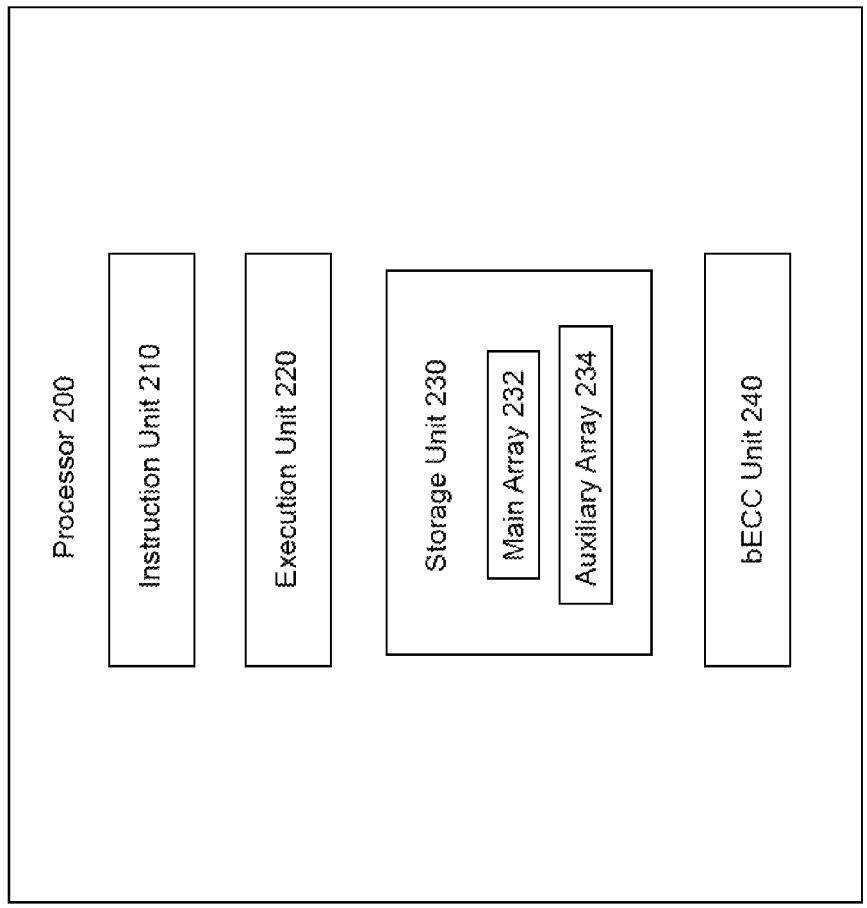
FIG. 2 illustrates a processor including consecutive bit error detection and correction according to an embodiment of the present invention

FIG. 2 illustrates processor 200, an embodiment of which may serve as processor 110 in system 100. Processor 200 may include instruction unit 210, execution unit 220, storage unit 230 (which may correspond to an embodiment of storage unit 112 in FIG. 1), bECC unit 240 (which may correspond to an embodiment of bECC unit 114 in FIG. 1), and any other circuitry, structures, or logic not shown in FIG. 2. Although storage unit 230 (and 112) and bECC unit 240 (and 114) and are shown as separate, individual units in FIG. 2 (and FIG. 1), the hardware and/or functionality of storage unit 220 (and 112) and bECC unit 240 (and 114), as introduced above and further described below, may be contained in or distributed among any of the labeled units or elsewhere in processor 200 or system 100.

Instruction unit 210 may include any circuitry, logic, structures, and/or other hardware to fetch, receive, decode, interpret, schedule, and/or otherwise handle instructions to be executed by processor 200. Execution unit 220 may include any circuitry, logic, structures, and/or other hardware, such as arithmetic units, logic units, floating point units, shifters, etc., to process data and execute instructions, micro-instructions, and/or micro-operations.

Storage unit 230 may represent any structure to store information, including data and/or instructions, in an information processing system, such as a register, a buffer, a cache, or another type of memory structure fully or partially protected from errors according to an embodiment of the present invention. Storage unit 230 may include any type of individual storage cells or elements, such as latches or flip-flops, to store bits of data or other information.

FIG. 2 shows storage unit 230 as including main array 232 and auxiliary array 234, each as further described below, which may represent an embodiment in which auxiliary array 234 is implemented together, physically, with main array 232. However, use of auxiliary array 234, which may be generally described as the storage for the ECC bits (but not the parity bits, which are included in main array 232 with the data bits), may be limited to error correction (and not needed for error detection), so auxiliary array 234 may be implemented with only one read port and/or may be implemented physically separate from main array 232, e.g., outside of storage array 230 and/or processor 200. Such a separate implementation may be desirable to provide for smaller area and/or lower power.

bECC unit 240 may represent any circuitry, logic, structures, and/or other hardware to protect storage unit 230, or any portion thereof, from errors according to an embodiment of the present invention. FIG. 2 shows bECC unit 240 and storage unit 230 as separate units; however, the hardware and/or functionality of each may overlap with each other and/or any other units of processor 200.

Figure 3:
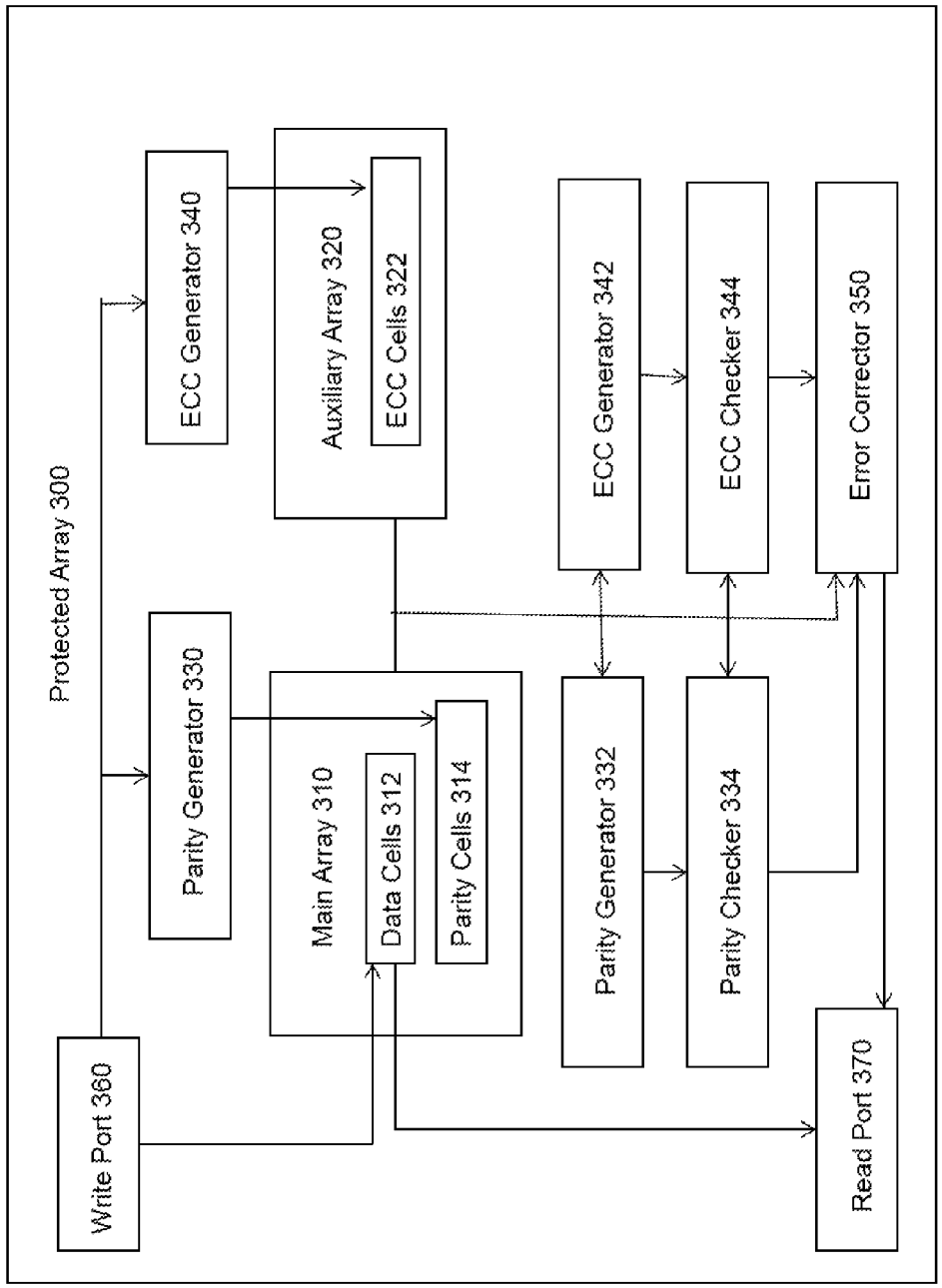
FIG. 3 illustrates a memory array including consecutive bit error detection and correction according to an embodiment of the present invention.

FIG. 3 illustrates an embodiment of the present invention in bECC protected array 300, which may serve as storage unit 240 and bECC unit 240 in processor 200. bECC protected array 300 may include main array 310, auxiliary array 320, parity generators 330 and 332, ECC generators 340 and 342, parity checker 334, ECC checker 344, error corrector 350, write port 360, and read port 370. Main array 310 includes data cells 312 and parity cells 314, where parity cells 314 may be interleaved (physically or otherwise) with data cells 312, as further described below or known in the art.

Parity generators 330 and 332 and ECC generators 340 and 342 may include any circuitry, logic, or other hardware to generate parity and ECC values to be used to detect and correct errors in data stored in main array 310. Parity generators 330 and 332 may represent a single parity generator shared to implement the functionalities described below, two separate parity generators, or any other implementation. ECC generators 340 and 342 may represent a single ECC generator shared to implement the functionalities described below, two separate ECC generators, or any other implementation. The parity and ECC value generation may be performed at any time relative to the execution of the instruction associated with the generation of the data value, writing of the data value, and/or reading of the data value. For example, a parity or ECC value may be generated in parallel with the generation of the data value, before the data value is written, after the data value is written, as the data value is read, or after the data value is read.

Parity checker 334 and ECC checker 344 may include any circuitry, logic, or other hardware to use the generated parity and ECC values to check for errors in data stored in main array 310. Parity checker 334 and ECC checker 344 may represent, respectively, a single parity or ECC checker to implement the functionalities described below, two or more separate parity or ECC checkers, or any other implementation. Furthermore, the functionalities, as described below or otherwise known in the art, of parity generators 330 and 332, ECC generators 340 and 342, parity checker 334, and ECC checker 344 may be achieved through any combination of circuitry or other hardware.

Write port 360 may represent any number of ports or interfaces through which to write to main array 310 and/or auxiliary array 320, for example from execution unit 220 or otherwise. Read port 370 may represent any number of ports or interfaces through which to read from main array 310 and/or auxiliary array 320, for example to execution unit 220 or otherwise.

In an embodiment, main array 310 may include a number of rows, chunks, or other subset (each may be referred to as a row), each row having 128 data bits or cells 312 and 4 parity bits or cells 314. Each parity bit may be used to protect 32 data bits in an interleaved fashion; for example, a first parity bit protects data bits 0, 4, 8, . . . 124; a second parity bit protects data bits 1, 5, 9, . . . 125; a third parity bit protects data bits 2, 6, 10, . . . 126; and a fourth parity bit protects data bits 3, 7, 11, . . . 127. For example, parity generators 330 and 332 may include exclusive-OR (XOR) gates to calculate even parity by generating a parity bit that would be set to a logical '1' value when the number of inputs having a logical '1' value is odd and set to a logical '0' value when the number of inputs having a logical '1' value is even. In various embodiments, parity values may be single parity bits or multiple parity bits with parity calculated over any number of data bits.

In an embodiment, auxiliary array 320 may include eight Hamming code or ECC bits or cells 322 (which may be referred to as ECC bits) per row of main array 310. As described below, ECC bits for a row may be used with parity bits for the row to correct an error detected in a row based on the parity bits. For example, in connection with writing a row of 128 data bits 312 to main array 310, parity generator 330 may generate, based on the values of the 128 data bits to be written, four parity bits 314 to be written to main array 310, and ECC generator 340 may generate (as described below) eight ECC bits 322 to be written to auxiliary array 320. Then, in connection with reading that row of 128 data bits 312 from main array 310, parity generator 332 may generate, based on the values of the 128 data bits read, four parity bits to be used as inputs to parity checker 334.

Parity checker 334 may include XOR gates or any other type of comparators to compare the value of each parity bit 314 stored in main array 310 with each corresponding parity bit generated by parity generator 332. If a mismatch is detected, then ECC checker 344 may be used to generate an ECC syndrome, which, along with the output of parity checker 334, may be used by error corrector 350 to correct errors in data bits and/or parity bits stored in main array 310, as further described below. Therefore, auxiliary array 320 need not be read, and ECC generator 342 and ECC checker 344 need not be activated or otherwise used unless a parity error is detected by parity checker 334, thereby saving power. Furthermore, based on the likelihood that only one row will need to be corrected per clock cycle, auxiliary array 320 may include only one read port, thereby saving area and power.

In one embodiment, ECC generator 340 may generate eight ECC bits to cover 128 data bits such that errors in two consecutive bits may be identified and corrected. For example, a row or set of 128 bits may be divided into quadrants of 32 bits each as follows: quadrant 0 includes data bits 0, 4, 8, . . . 124; quadrant 1 includes data bits 1, 5, 9, . . . 125; quadrant 2 includes data bits 2, 6, 10, . . . 126; and quadrant 3 includes data bits 3, 7, 11, . . . 127. Each of the eight ECC bits may be assigned to cover or otherwise correspond to one of eight different, partially overlapping subsets of data bits in each quadrant, such that the per-quadrant value of the ECC bit is flipped by or otherwise based on (e.g. is the XOR of) each bit of the subset. The value of each ECC bit is then computed as the result of XORing the four per-quadrant ECC values.

Tables 2, 3, 4, and 5 show the ECC bit assignments to subsets of data bits for quadrants 0, 1, 2, and 3, respectively, according to one such embodiment. In an embodiment according to Tables 2, 3, 4, and 5, the same pattern is used for each of the quadrants, but the assignment of ECC bits to data bits is shifted by one ECC bit per quadrant. For example, ECC bits 0, 1, and 2 are assigned to the lowest-order data bit of quadrant 0 (data bit 0); ECC bits 1, 2, and 3 are assigned to the lowest-order data bit of quadrant 1 (data bit 1); ECC bits 2, 3, and 4 are assigned to the lowest-order data bit of quadrant 2 (data bit 2); and ECC bits 3, 4, and 5 are assigned to the lowest-order data bit of quadrant 3 (data bit 3).

TABLE 2

| Data Bit | ECC Bit | | | | | | | |
|---|---|---|---|---|---|---|---|---|
| | 0 | 1 | 2 | 3 | 4 | 5 | 6 | 7 |
| 0 | X | X | X | | | | | |
| 4 | X | X | | X | | | | |
| 8 | X | X | | | X | | | |
| 12 | X | X | | | | X | | |
| 16 | X | | | | X | | X | |
| 20 | X | X | | | | | | X |
| 24 | X | | X | X | | | | |
| 28 | X | | | X | | X | | |
| 32 | X | X | | | | | | |
| 36 | X | | X | | | | | |
| 40 | X | | | X | | | | |
| 44 | X | | | | X | | | |
| 48 | X | | | | | X | | |
| 52 | X | | | | | | X | |
| 56 | X | | | | | | | X |
| 60 | | X | X | | | | | |

TABLE 2-continued

| Data Bit | ECC Bit | | | | | | | |
|---|---|---|---|---|---|---|---|---|
| | 0 | 1 | 2 | 3 | 4 | 5 | 6 | 7 |
| 64 | | X | | X | | | | |
| 68 | | X | | | X | | | |
| 72 | | X | | | | X | | |
| 76 | | X | | | | | x | |
| 80 | | X | | | | | | X |
| 84 | | | X | X | | | | |
| 88 | | | X | | X | | | |
| 92 | | | X | | | X | | |
| 96 | | | X | | | | X | |
| 100 | | | X | | | | | X |
| 104 | | | | X | X | | | |
| 108 | | | | X | | X | | |
| 112 | | | | X | | | X | |
| 116 | | | | X | | | | X |
| 120 | | | | | | X | X | X |
| 124 | | | | | X | | X | |

TABLE 3

| Data Bit | ECC Bit | | | | | | | |
|---|---|---|---|---|---|---|---|---|
| | 1 | 2 | 3 | 4 | 5 | 6 | 7 | 0 |
| 1 | X | X | X | | | | | |
| 5 | X | X | | X | | | | |
| 9 | X | X | | | X | | | |
| 13 | X | X | | | | X | | |
| 17 | X | | | X | | X | | |
| 21 | X | X | | | | | | X |
| 25 | X | | X | X | | | | |
| 29 | X | | | X | | X | | |
| 33 | X | X | | | | | | |
| 37 | X | | X | | | | | |
| 41 | X | | | X | | | | |
| 45 | X | | | | X | | | |
| 49 | X | | | | | X | | |
| 53 | X | | | | | | X | |
| 57 | X | | | | | | | X |
| 61 | | X | X | | | | | |
| 65 | | X | | X | | | | |
| 69 | | X | | | X | | | |
| 73 | | X | | | | X | | |
| 77 | | X | | | | | X | |
| 81 | | X | | | | | | X |
| 85 | | | X | X | | | | |
| 89 | | | X | | X | | | |
| 93 | | | X | | | X | | |
| 97 | | | X | | | | X | |
| 101 | | | X | | | | | X |
| 105 | | | | X | X | | | |
| 109 | | | | X | | X | | |
| 113 | | | | X | | | X | |
| 117 | | | | X | | | | X |
| 121 | | | | | | X | X | X |
| 125 | | | | | X | | X | |

TABLE 4

| Data Bit | ECC Bit | | | | | | | |
|---|---|---|---|---|---|---|---|---|
| | 2 | 3 | 4 | 5 | 6 | 7 | 0 | 1 |
| 2 | X | X | X | | | | | |
| 6 | X | X | | X | | | | |
| 10 | X | X | | | X | | | |
| 14 | X | X | | | | X | | |
| 18 | X | | | X | | X | | |
| 22 | X | X | | | | | | X |
| 26 | X | | X | X | | | | |
| 30 | X | | | X | | X | | |
| 34 | X | X | | | | | | |

TABLE 4-continued

| Data Bit | ECC Bit | | | | | | | |
|---|---|---|---|---|---|---|---|---|
| | 2 | 3 | 4 | 5 | 6 | 7 | 0 | 1 |
| 38 | X | | X | | | | | |
| 42 | X | | | X | | | | |
| 46 | X | | | | X | | | |
| 50 | X | | | | | X | | |
| 54 | X | | | | | | X | |
| 58 | X | | | | | | | X |
| 62 | | X | X | | | | | |
| 66 | | X | | X | | | | |
| 70 | | X | | | X | | | |
| 74 | | X | | | | X | | |
| 78 | | X | | | | | X | |
| 82 | | X | | | | | | X |
| 86 | | | X | X | | | | |
| 90 | | | X | | X | | | |
| 94 | | | X | | | X | | |
| 98 | | | X | | | | X | |
| 102 | | | X | | | | | X |
| 106 | | | | X | X | | | |
| 110 | | | | X | | X | | |
| 114 | | | | X | | | X | |
| 118 | | | | X | | | | X |
| 122 | | | | | | X | X | X |
| 126 | | | | | | | X | X |

TABLE 5

| Data Bit | ECC Bit | | | | | | | |
|---|---|---|---|---|---|---|---|---|
| | 3 | 4 | 5 | 6 | 7 | 0 | 1 | 2 |
| 3 | X | X | X | | | | | |
| 7 | X | X | | X | | | | |
| 11 | X | X | | | X | | | |
| 15 | X | X | | | | X | | |
| 19 | X | | | X | | X | | |
| 23 | X | X | | | | | | X |
| 27 | X | | X | X | | | | |
| 31 | X | | | X | X | | | |
| 35 | X | X | | | | | | |
| 39 | X | | X | | | | | |
| 43 | X | | | X | | | | |
| 47 | X | | | | X | | | |
| 51 | X | | | | | X | | |
| 55 | X | | | | | | X | |
| 59 | X | | | | | | | X |
| 63 | | X | X | | | | | |
| 67 | | X | | X | | | | |
| 71 | | X | | | X | | | |
| 75 | | X | | | | X | | |
| 79 | | X | | | | | X | |
| 83 | | X | | | | | | X |
| 87 | | | X | X | | | | |
| 91 | | | X | | X | | | |
| 95 | | | X | | | X | | |
| 99 | | | X | | | | X | |
| 103 | | | X | | | | | X |
| 107 | | | | X | X | | | |
| 111 | | | | X | | X | | |
| 115 | | | | X | | | X | |
| 119 | | | | X | | | | X |
| 123 | | | | | | X | X | X |
| 127 | | | | | | | X | X |

Embodiments of the present invention may also be used for data values of less than 128 bits (e.g., 64 bits, 32 bits) by assuming that the values in the unused bits are all zeroes, and simplifying the parity and ECC generators accordingly.

Error corrector 350 may include any circuitry, logic, structures, and/or other hardware to correct errors in data or other information. In an embodiment using four parity bits and eight ECC bits, where per-quadrant values of the ECC bits may be computed as described above, single bit errors and double bit errors involving consecutive bits may be identified and corrected as follows.

For a single bit error in which one of the 128 data bits was flipped, one of the parity bits will be flipped and more than one (e.g., three) of the error syndrome bits will be flipped. Error corrector 350 may determine which quadrant contains the error based on the flipped parity bit, determine which bit within the quadrant to correct based on the error syndrome, and flip that bit to correct the error. Error syndrome aliasing between quadrants may be resolved using the parity syndrome.

For a single bit error in which one of the four parity bits was flipped, the error syndrome will be zero. Error corrector 350 may determine that the error is in the parity bit based on the error syndrome, and flip that parity bit to correct the error.

For a single bit error in which one of the eight ECC bits was flipped, none of the parity bits will be flipped so the error will not be detected by parity checker 334 and may be safely ignored because the ECC bits need not be used.

For errors in two consecutive data bits, the two data bits will be in different quadrants because the quadrants are interleaved, so two of the parity bits will be flipped. Error corrector 350 may determine which quadrants contain the errors based on the flipped parity bits. The ECC generation scheme detailed above provides a unique error syndrome when two consecutive data bits are flipped, so error corrector 350 may determine which bits to correct, and flip those bits to correct the errors.

For errors in two consecutive parity bits, the error syndrome will be zero. Error corrector 350 may determine that the errors are in parity bits based on the error syndrome, and flip those parity bits to correct the error.

For errors in two consecutive ECC bits, none of the parity bits will be flipped so the error will not be detected by parity checker 334 and may be safely ignored because the ECC bits need not be used.

Errors in two consecutive bits where one bit is a data bit and the other bit is a parity bit may be avoided with a specific ordering of the bits, shown in Table 6, in which the auxiliary array (holding the ECC bits) is merged with the main array (holding the data and parity bits).

TABLE 6

| Parity Domain | Data | Parity Domain | Data | Parity Domain | Data | Parity Domain | Data |
|---|---|---|---|---|---|---|---|
| 3 | 127 | 3 | 95 | 3 | 63 | 3 | 31 |
| 2 | 126 | 2 | 94 | 2 | 62 | 2 | 30 |
| 1 | 125 | 1 | 93 | 1 | 61 | 1 | 29 |
| 0 | 124 | 0 | 92 | 0 | 60 | 0 | 28 |
| 3 | 123 | 3 | 91 | 3 | 59 | 3 | 27 |
| 2 | 122 | 2 | 90 | 2 | 58 | 2 | 26 |
| 1 | 121 | 1 | 89 | 1 | 57 | 1 | 25 |
| 0 | 120 | 0 | 88 | 0 | 56 | 0 | 24 |
| 3 | 119 | 3 | 87 | 3 | 55 | 3 | 23 |
| 2 | 118 | 2 | 86 | 2 | 54 | 2 | 22 |
| 1 | 117 | 1 | 85 | 1 | 53 | 1 | 21 |
| 0 | 116 | 0 | 84 | 0 | 52 | 0 | 20 |
| 3 | 115 | 3 | 83 | 3 | 51 | 3 | 19 |
| 2 | 114 | 2 | 82 | 2 | 50 | 2 | 18 |
| 1 | 113 | 1 | 81 | 1 | 49 | 1 | 17 |
| 0 | 112 | 0 | 80 | 0 | 48 | 0 | 16 |
| 3 | 111 | 3 | 79 | 3 | 47 | 3 | 15 |
| 2 | 110 | 2 | 78 | 2 | 46 | 2 | 14 |
| 1 | 109 | 1 | 77 | 1 | 45 | 1 | 13 |
| 0 | 108 | 0 | 76 | 0 | 44 | 0 | 12 |
| 3 | 107 | 3 | 75 | 3 | 43 | 3 | 11 |
| 2 | 106 | 2 | 74 | 2 | 42 | 2 | 10 |

TABLE 6-continued

| Parity Domain | Data | Parity Domain | Data | Parity Domain | Data | Parity Domain | Data |
|---|---|---|---|---|---|---|---|
| 1 | 105 | 1 | 73 | 1 | 41 | 1 | 9 |
| 0 | 104 | 0 | 72 | 0 | 40 | 0 | 8 |
| 3 | 103 | 3 | 71 | 3 | 39 | 3 | 7 |
| 2 | 102 | 2 | 70 | 2 | 38 | 2 | 6 |
| 1 | 101 | 1 | 69 | 1 | 37 | 1 | 5 |
| 0 | 100 | 0 | 68 | 0 | 36 | 0 | 4 |
| 3 | 99 | 3 | 67 | 3 | 35 | 3 | 3 |
| 2 | 98 | 2 | 66 | 2 | 34 | 2 | 2 |
| 1 | 97 | 1 | 65 | 1 | 33 | 1 | 1 |
| 0 | 96 | 0 | 64 | 0 | 32 | 0 | 0 |
| None | ECC7 | None | ECC5 | None | ECC3 | None | ECC1 |
| 3 | P3 | 2 | P2 | 1 | P1 | 0 | P0 |
| None | ECCE | None | ECC4 | None | ECC2 | None | ECC0 |

Errors in two consecutive bits where one bit is a data bit and the other bit is an ECC bit will each result in a unique error syndrome that will indicate the ECC bit error. Error corrector 350 may correct the error in the ECC bit by flipping that bit, then finding and correcting the data or parity bit error as described above for an error in a single data or parity bit.

Errors in two consecutive bits where one bit is a parity bit and the other bit is an ECC bit will be the only case that results in only one of the error syndrome bits and one parity bit being flipped. Error corrector 350 may correct the error in the ECC bit by flipping that bit, then finding and correcting the parity bit error.

Figure 4:
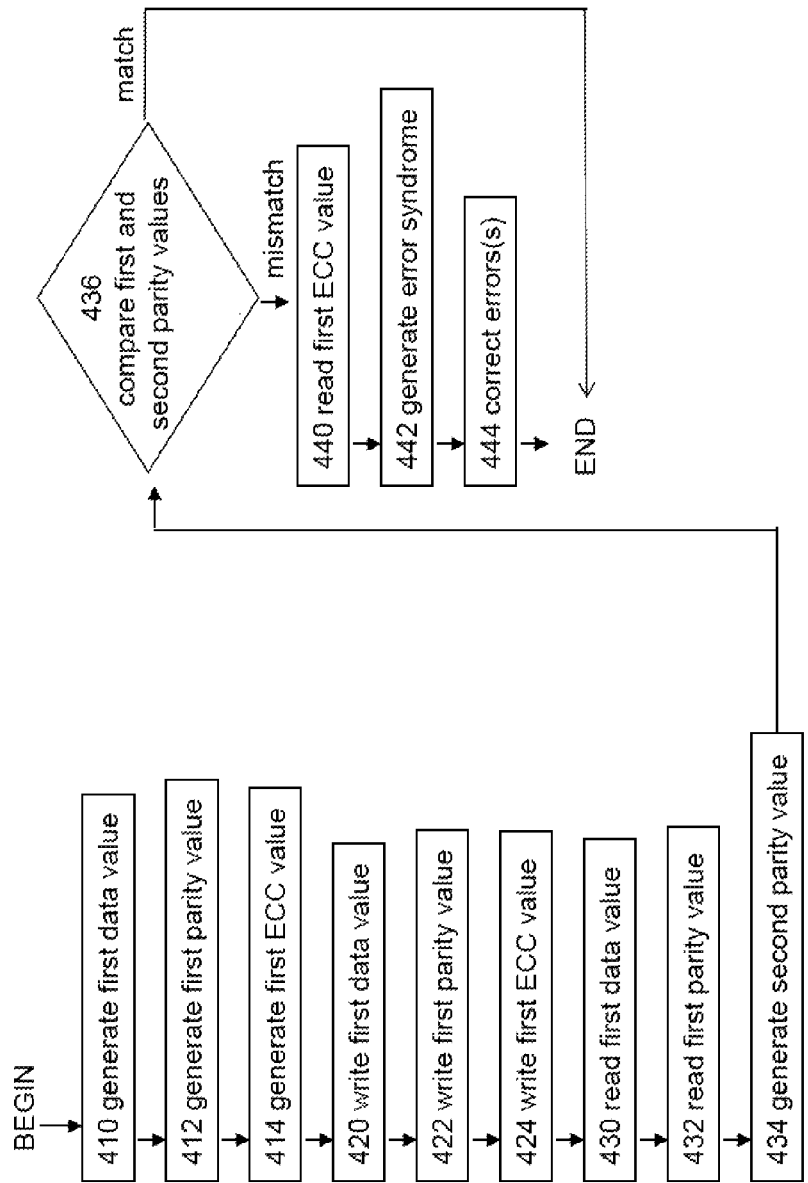
FIG. 4 illustrates a method including consecutive bit error detection and correction according to an embodiment of the present invention.

FIG. 4 illustrates method 400 for consecutive bit error detection and correction according to an embodiment of the present invention. Although method embodiments are not limited in this respect, reference may be made to elements of the embodiment of FIGS. 1, 2, and 3 in the description of the method embodiment of FIG. 4.

In box 410, a first data value is generated, fetched, or otherwise provided; for example, 128 bits of data may be generated by an execution unit such as execution unit 220 in processor 200. In box 412, a first parity value is generated, by parity generator 330, based on the first data value. In box 414, a first ECC value is generated, by ECC generator 340, based on the first ECC value.

In box 420, the first data value is written to or stored in a first location in main array 310; for example, in a first row of data cells 312. In box 422, the first parity value is written to or stored in a second location in main array 310; for example, in a first row of parity cells 314 corresponding to the first row of data cells 312. In box 424, the first ECC value is written to or stored in a first location in auxiliary array 320; for example, in a first row of ECC cells 322.

In box 430, the contents of the first location in main array 310 (where the first data value was stored) are read, for example, in connection with the execution, by execution unit 220, of an instruction requiring the first data value. In box 432, the contents of the second location in main array 310 (where the first parity value was stored) are read. In box 434, a second parity value is generated, by parity generator 332, based on the contents of the first location. In box 436, the second parity value is compared, by parity checker 334, to the contents of the second location (where the first parity value was stored). If they are equal, then no error has been detected in the contents of the first location or second locations in main array 310 (e.g., neither the contents of the first location nor the second location in main array 310 have been changed by an error since the first data value and the first parity value were stored), and method 400 may end without activating or otherwise using ECC generator 342, ECC checker 344, and/or error corrector 350, and/or without reading from auxiliary array 320. However, if they are not equal, then an error has been detected in the contents of the first or second location in main array 310 (e.g., either the contents of the first location or the second location in main array 310 have been changed by an error since the first data value and the first parity value were stored), and method 400 continues in box 440.

In box 440, the contents of the first location in auxiliary array 320 (where the first ECC value was stored) are read. In box 442, ECC generator 340 and/or ECC checker 344 may generate an error code and/or an error syndrome based on all or part (e.g., a quadrant) of the contents of the first location in main array 310, the second location in main array 310, and/or the first location in auxiliary array 320. In box 444, ECC corrector 350 may use the error code and/or the error syndrome, along with the output of parity generator 332 and/or parity checker 334 to correct a single bit error or an error in consecutive bits of the information stored in the first and/or second locations of main array 310 and/or the information read from the first and/or second locations of main array 310.

Within the scope of the present invention, the method illustrated in FIG. 4 may be performed in a different order, with illustrated boxes omitted, with additional boxes added, or with a combination of reordered, omitted, or additional boxes. For example, boxes 412 and 414 may be performed during the same clock cycle; boxes 420, 422, and 424 may be performed in the same clock cycle; and/or boxes 430 and 432 may be performed in the same clock cycle. These are just a few of the many variations of methods 400 that are possible.

Embodiments or portions of embodiments of the present invention, as described above, may be stored on any form of a machine-readable medium. For example, all or part of method 400 may be embodied in software or firmware instructions that are stored on a medium readable by processor 110, which when executed by processor 110, cause processor 110 to execute an embodiment of the present invention. Also, aspects of the present invention may be embodied in data stored on a machine-readable medium, where the data represents a design or other information usable to fabricate all or part of processor 110.

Thus, embodiments of an invention for consecutive bit error detection and correction have been described. While certain embodiments have been described, and shown in the accompanying drawings, it is to be understood that such embodiments are merely illustrative and not restrictive of the broad invention, and that this invention not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:

1. An apparatus comprising:
   a storage structure in which to store 128 data bits of a plurality of 128-bit data values, four parity bits of a plurality of 4-bit party values, and eight error correction code (ECC) bits of a plurality of 8-bit ECC values, each parity value corresponding to one of the plurality of the data value, a first bit of each parity value corresponding to a first quadrant of the corresponding data value, wherein the first quadrant of the corresponding data value is interleaved with a second quadrant of the corresponding data value, wherein a second bit each parity value corresponds to the second quadrant of the corresponding data value, each ECC value corresponding to one of the plurality of data values, wherein a first ECC bit, a second ECC bit, and a third ECC bit of each ECC value are assigned to first data bit of the first quadrant, wherein the second ECC bit, the third ECC bit, and fourth ECC bit of each ECC value are assigned to the first data bit of the second quadrant, wherein the third ECC bit, the fourth ECC bit, and a fifth ECC bit of each ECC value are assigned to the first data bit of a third quadrant of the corresponding data value, and wherein the fourth ECC bit, the fifth ECC bit, and a sixth ECC bit of each ECC value are assigned to the first data bit of a fourth quadrant of the corresponding data value;

a parity checker to detect a parity error in a data value stored in the first storage structure using a parity value corresponding to the data value;

an ECC checker to be activated to generate a syndrome only if the parity checker detects the parity error; and an error corrector to detect and, if the parity error corresponds to an error in a single data value bit or two physically consecutive data value bits, correct the error in the data value using the syndrome.

2. The apparatus of claim 1, wherein at least two of the eight ECC bits are assigned to each of the 128 data bits such that any error in any two physically consecutive data bits is identifiable and correctable.

3. The apparatus of claim 2, wherein each bit of each parity value is to cover a quadrant.

4. The apparatus of claim 3, wherein each bit of each ECC value is to cover one of eight partially overlapping subsets of data bits in each quadrant according to a pattern.

5. The apparatus of claim 4, wherein the pattern is shifted by one ECC bit per quadrant.

6. The apparatus of claim 1, wherein the storage structure includes a first portion in which to store the plurality of data values and the plurality of parity values and a second portion in which to store the plurality of ECC values, the second portion physically separate from the first portion.

7. The apparatus of claim 1, wherein the parity values and the ECC values provide error correction capability for errors in two consecutive bits.

8. The apparatus of claim 7, wherein the parity values provide error detection capability for errors in four consecutive bits.

9. A method comprising:
detecting a parity error in a 128-bit data value using a 4-bit parity value corresponding to the data value, wherein a first bit of the parity value corresponds to a first quadrant of the data value, wherein the first quadrant of the data value is interleaved with a second quadrant of the data value, wherein a second bit of the parity value corresponds to the second quadrant of the data value, wherein each ECC value corresponds to one of the plurality of data values, wherein a first ECC bit, a second ECC bit, and a third ECC bit of each ECC value are assigned to first data bit of the first quadrant, wherein the second ECC bit, the third ECC bit, and a fourth ECC bit of each ECC value are assigned to the first data bit of the second quadrant, wherein the third ECC bit, the fourth ECC bit, and a fifth ECC bit of each ECC value are assigned to the first data bit of a third quadrant of the corresponding data value, and wherein the fourth ECC bit, the fifth ECC bit, and a sixth ECC bit of each ECC value are assigned to the first data bit of a fourth quadrant of the corresponding data value;

activating an ECC checker to generate an error correction code (ECC) syndrome using an ECC value corresponding to the data value only if the parity error is detected; and detecting and, if the parity corresponds to an error in a single data value bit or two physically consecutive data value bits, correcting the error in the data value using the syndrome.

10. The method of claim 9, wherein the portions are quadrants.

11. The method of claim 10, the parity value and the ECC value provide error correction capability for errors in two consecutive bits, and the parity value provides error detection capability for errors in four consecutive bits.

12. The method of claim 9, wherein at least two of the eight ECC bits are assigned to each of the 128 data bits such that any error in any two physically consecutive data bits is identifiable and correctable.

13. The method of claim 12, wherein each of the eight ECC value is cover one of eight partially overlapping subsets of data bits in each quadrant according to a pattern.

14. The method of claim 13, wherein the pattern is shifted by one ECC bit per quadrant.

15. A system comprising:
a system memory in which to store a plurality of 128-bit data values; and
a processor including:
a storage structure including 128 data bits in which to store a subset of the plurality of 128-bit data values, four parity in which to store a plurality of 4-bit parity values, and eight error correction code(ECC)bits in which to store a plurality of 8-bit ECC values, each parity value corresponding to one of the subset of the plurality of data values, a first bit of each parity value corresponding to a first quadrant of a corresponding data value, wherein the first quadrant of the corresponding data value is interleaved with a second quadrant of the corresponding data value, wherein a second bit of each parity value corresponds to the second quadrant of the corresponding data value, each ECC value corresponding to one of the plurality of data values, wherein a first ECC bit, a second ECC bit, and a third ECC bit of each ECC value are assigned to first data bit of the first quadrant, wherein the second ECC bit, the third ECC bit, and a fourth ECC bit of each ECC value are assigned to the first data bit of the second quadrant, wherein the third ECC bit, the fourth ECC bit, and a fifth ECC bit of each ECC value are assigned to the first data bit of a third quadrant of the corresponding data value, and wherein the fourth ECC bit, the fifth ECC bit, and a sixth ECC bit of each ECC value are assigned to the first data bit of a fourth quadrant of the corresponding data value;

a parity checker to detect a parity error in a data value stored in the storage structure using a parity value corresponding to the data value;

an ECC checker to be activated to generate a syndrome only if the parity checker detects the parity error; and an error corrector to detect and, if the parity error corresponds to an error in a single data value bit or two physically consecutive data value bits, correct the error in the data value using the syndrome.

* * * * *